United States Patent
Inoue

(10) Patent No.: US 7,839,907 B2
(45) Date of Patent: Nov. 23, 2010

(54) LASER DRIVING APPARATUS

(75) Inventor: Shuji Inoue, Okayama (JP)

(73) Assignee: Panasonic Corporation, Osaka (JP)

( * ) Notice: Subject to any disclaimer, the term of this patent is extended or adjusted under 35 U.S.C. 154(b) by 44 days.

(21) Appl. No.: 12/465,244

(22) Filed: May 13, 2009

(65) Prior Publication Data

US 2009/0290609 A1   Nov. 26, 2009

(30) Foreign Application Priority Data

May 21, 2008   (JP) .............................. 2008-132764

(51) Int. Cl.
 *H01S 3/04* (2006.01)
(52) U.S. Cl. .......................................... 372/34; 372/36
(58) Field of Classification Search ................... 372/34, 372/38.02, 35
 See application file for complete search history.

(56) References Cited

U.S. PATENT DOCUMENTS

| 5,168,503 A * | 12/1992 | Maeda ........................ 372/22 |
| 5,265,115 A * | 11/1993 | Amano ........................ 372/75 |
| 5,341,388 A * | 8/1994 | Masuda et al. ................ 372/36 |
| 2008/0175286 A1 * | 7/2008 | Kamijima .................... 372/30 |

FOREIGN PATENT DOCUMENTS

| JP | 2001-168439 | 6/2001 |
| JP | 2003-174222 | 6/2003 |
| JP | 2003-298180 | 10/2003 |

* cited by examiner

*Primary Examiner*—Minsun Harvey
*Assistant Examiner*—Tuan N. Nguyen
(74) *Attorney, Agent, or Firm*—Hamre, Schumann, Mueller & Larson, P.C.

(57) ABSTRACT

Laser driving apparatus in which a temperature is controlled such that an optical output is maximum, even when a laser device using an optical wavelength conversion element is used in a backlight source of a liquid crystal display that adjusts light dynamically. Current detection section 5 detects an average value of a driving current by which laser device 1 is pulse-driven. Optical detection section 3 detects an average value of an optical output from laser device 1. Efficiency detection section 9 calculates a ratio of an output from optical detection section 3 to an output from current detection section 5. A temperature setting value at which an efficiency value which is a result of the computation is maximum is provided to temperature control section 7 and a temperature of nonlinear optical crystal 12 of laser device 1 is controlled, whereby laser device 1 is driven such that the optical output from laser device 1 is always maximum.

4 Claims, 8 Drawing Sheets

LASER DRIVING APPARATUS

CROSS REFERENCE TO RELATED APPLICATIONS

The disclosure of Japanese Patent Application No. 2008-132764 filed on May 21, 2008 including the specification, drawings and abstract is incorporated herein by reference in its entirety.

BACKGROUND

1. Technical Field

The technical field relates to a laser driving apparatus used in a laser light source for a display use.

2. Description of the Related Art

Conventionally, a laser device including a semiconductor laser unit that emits excited laser light and an optical wavelength conversion element of a nonlinear optical crystal that performs wavelength conversion of the excited laser light, as a fundamental wave, to laser light having a predetermined wavelength has been known.

In such a laser device using a nonlinear optical crystal, an optical output changes depending on the temperature of the nonlinear optical crystal. FIG. 1 shows a graph of characteristic showing a relationship between the temperature and optical output of a nonlinear optical crystal when the constant amount of light enters the nonlinear optical crystal from an excitation semiconductor laser unit. As shown in FIG. 1, there is an optimum temperature at which the optical output is maximum, and therefore temperature needs to be controlled such that the temperature of the nonlinear optical crystal reaches the optimum temperature.

However, the temperature versus optical output characteristic of the nonlinear optical crystal changes depending on usage environment or a change over time.

In a control method for controlling an optical output to be constant, taking into account such a change, control is performed such that, when the temperature of the nonlinear optical crystal is shifted from the optimum temperature, the output from the excitation semiconductor laser unit is increased. As a result, a driving current increases. In view of this, a technique of detecting the increase in driving current and controlling the temperature of the nonlinear optical crystal such that the detected value is a predetermined value is proposed (for example, Japanese Patent Application Laid-Open No. 2001-168439).

FIG. 2 is a block diagram showing a configuration of an example of a conventional laser driving apparatus.

In FIG. 2, reference numeral 1 denotes a laser device including semiconductor laser unit 11 as an excitation laser unit that emits excited laser light and nonlinear optical crystal 12 as an optical wavelength conversion element that performs wavelength conversion of the excited laser light, as a fundamental wave, to laser light having a predetermined wavelength. Reference numeral 2 denotes a driving section for causing semiconductor laser unit 11 to emit excited laser light. Reference numeral 3 denotes an optical detection section for detecting an optical output of the laser light whose wavelength is converted, exiting from laser device 1. Reference numeral 4 denotes an optical output control section for comparing an optical detection value outputted from optical detection section 3 with an optical output target value, to calculate a control value, and outputting the control value to driving section 2, whereby the optical output of the laser light exiting from laser device 1 reaches the optical output target value. Reference numeral 5 denotes a current detection section for detecting a laser driving current of driving section 2. Reference numeral 6 denotes an operating temperature setting section for finding a temperature setting value from the current detection value from current detection section 5. Reference numeral 7 denotes a temperature control section for controlling the temperature of nonlinear optical crystal 12 to match the temperature setting value found by operating temperature setting section 6. Temperature control section 7 includes a Peltier element (not shown) for heating and cooling nonlinear optical crystal 12 and a temperature detecting element (not shown) that detects a temperature of nonlinear optical crystal 12.

Next, in the laser driving apparatus shown in FIG. 2, an operation of controlling a temperature in nonlinear optical crystal 12 so as to maximize the optical output from laser device 1 will be explained.

First, upon the start of lighting, operating temperature setting section 6 provides the temperature T0 set at the end of a previous operation as an initial temperature setting value to temperature control section 7, to cause temperature control section 7 to start temperature control. At this time, optical output control section 4 operates such that laser device 1 generates a target optical output, and operating temperature setting section 6 stores the current detection value I0 current detection section 5 detects at this time. After an appropriate time has elapsed, operating temperature setting section 6 shifts the temperature setting value to a higher value by a micro-temperature $\Delta T$ and stores the current detection value I1 detected at the temperature setting value T0+$\Delta T$. If I1$\leq$I0, operating temperature setting section 6 sets the current temperature setting value T0+$\Delta T$ as a new temperature setting value. On the other hand, if I1>I0, then operating temperature setting section 6 shifts the temperature setting value to a temperature setting value T0−$\Delta T$, which is lower than T0, and stores the current detection value I2 detected at the temperature setting value T0−$\Delta T$. If I2$\leq$I0, then the current temperature T0−$\Delta T$ is set as a new temperature setting value. On the other hand, if I2>I0, then operating temperature setting section 6 resets the temperature setting value to the initial temperature setting value T0. By the above-described operation, even when the temperature versus output characteristic of nonlinear optical crystal 12 changes over time, nonlinear optical crystal 12 can always operate at the optimum temperature.

A laser device composed of a nonlinear optical crystal is useful for, for example, a backlight source of a liquid crystal display. However, when the laser device is used in a backlight source of a liquid crystal display, it is necessary to adjust light dynamically.

However, when the laser driving apparatus shown in FIG. 2 is used in a backlight source of a liquid crystal display, there is a problem that, by frequently adjusting light for dynamic brightness adjustment, a current detection value changes and accordingly an optimum temperature setting value is not determined. Also, in a method of detecting an optical output and controlling a temperature such that the detected value is maximum, there is a problem that, when an optical output changes upon adjusting light, the maximum value of the optical output is not determined, and therefore control is difficult.

As methods of adjusting light of a laser device using an excitation laser unit and a nonlinear optical crystal, there are a method of changing a driving current linearly and a method of pulse width modulating (PWM) a driving current. From a viewpoint of an efficiency, PWM drive is more advantageous for the following reason.

In linear drive, the optical output from the nonlinear optical crystal is controlled by adjusting the driving current of the excitation laser unit. FIG. 3 shows a relationship between the input power and optical output of the laser device and a relationship between the input power and efficiency, for the case of the linear drive method. The optical output from the excitation laser unit is substantially proportional to the input power and the optical output from the nonlinear optical crystal is substantially proportional to a square of the optical output from the excitation laser unit, so that the optical output from the laser device increases in approximately proportional to a square of the input power and the efficiency increases approximately linearly relative to the input power. That is, the efficiency changes relative to the input power.

Next, FIGS. 4A to 4C show the relationships between an optical output and efficiency, and the driving current of the laser device in linear drive. The drive voltage of the excitation laser unit is substantially constant, and, consequently, the input power is substantially proportional to the driving current as shown in FIG. 4C. FIG. 4A shows the relationship between the driving current and the optical output. The optical output increases in approximately proportional to a square of the driving current and due to the influence of saturation of the optical output from the excitation laser unit, the optical output from the laser device gets saturated. FIG. 4B shows a relationship between the driving current and the efficiency. The efficiency increases in proportional to the driving current and due to the influence of saturation of the excitation laser unit, the efficiency decreases.

On the other hand, in PWM pulse drive, the average optical output from the nonlinear optical crystal is controlled by driving the excitation laser unit by a pulse current having a constant-amplitude and adjusting pulse duty. FIG. 5 shows the relationship between the average input power and average optical output of the laser device and the relationship between the average input power and efficiency, for the case of a PWM pulse drive method. The amplitude in PWM drive is constant, and so the average value is determined by duty. Consequently, the average optical output increases in proportional to the average input power and the efficiency is constant relative to the average input power. That is, the efficiency does not change relative to the average input power. In this way, in the case of PWM drive, the nonlinear optical crystal always operates at a high efficiency level.

As described above, in a case of operating a dynamic light adjustment, PWM drive is more advantageous from an efficient viewpoint, and therefore, the nonlinear optical crystal needs to operate at an optimum temperature further in PWM drive.

As shown in FIG. 1 showing the relationship between the temperature and optical output of a nonlinear optical crystal when the constant amount of light enters the nonlinear optical crystal from an excitation semiconductor laser unit, there is an optimum temperature at which the optical output is maximum, so that, as in the case of PWM drive, a temperature always needs to be controlled such that the optical output is maximum.

SUMMARY

It is therefore an object to provide a laser driving apparatus that allows a nonlinear optical crystal to operate at an optimum temperature by detecting a value corresponding to an efficiency and performing temperature control such that the value is maximum, even when light adjustments are dynamically operated in PWM drive.

The laser driving apparatus achieves the above object by adopting a configuration including: a laser device that includes an excitation laser unit that emits excited laser light and an optical wavelength conversion element that converts the excited laser light, as a fundamental wave, to laser light having a predetermined wavelength, and that emits the laser light, as an optical output, whose wavelength is converted by the optical wavelength conversion element; a driving section that drives the excitation laser unit of the laser device by a pulse current; an optical detecting section that detects an average value of the optical output in a pulse form emitted from the laser device and outputs the average value as an optical detection value; a current detecting section that detects a value corresponding to an average value of the pulse current and outputs the value as a current detection value; an efficiency detecting section that outputs, as an efficiency value, a value obtained by dividing the optical detection value by the current detection value; a maximization control section that receives as input the efficiency value and derives a temperature setting value such that the efficiency value is maximum; and a temperature control section that controls a temperature of the optical wavelength conversion element to reach the temperature setting value.

The present inventors have achieved the present invention by focusing on the fact that, in the case of adjusting light in PWM pulse drive, efficiency is substantially constant when the temperature of a nonlinear optical crystal is constant as shown in FIG. 5.

BRIEF DESCRIPTION OF THE DRAWINGS

The above and other objects and features of the invention will appear more fully hereinafter from a consideration of the following description taken in conjunction with the accompanying drawings wherein examples are illustrated by way of example, in which.

DETAILED DESCRIPTION OF THE PREFERRED EMBODIMENT

Embodiments of the present invention will be described below in detail with reference to the accompanying drawings.

Figure 6:
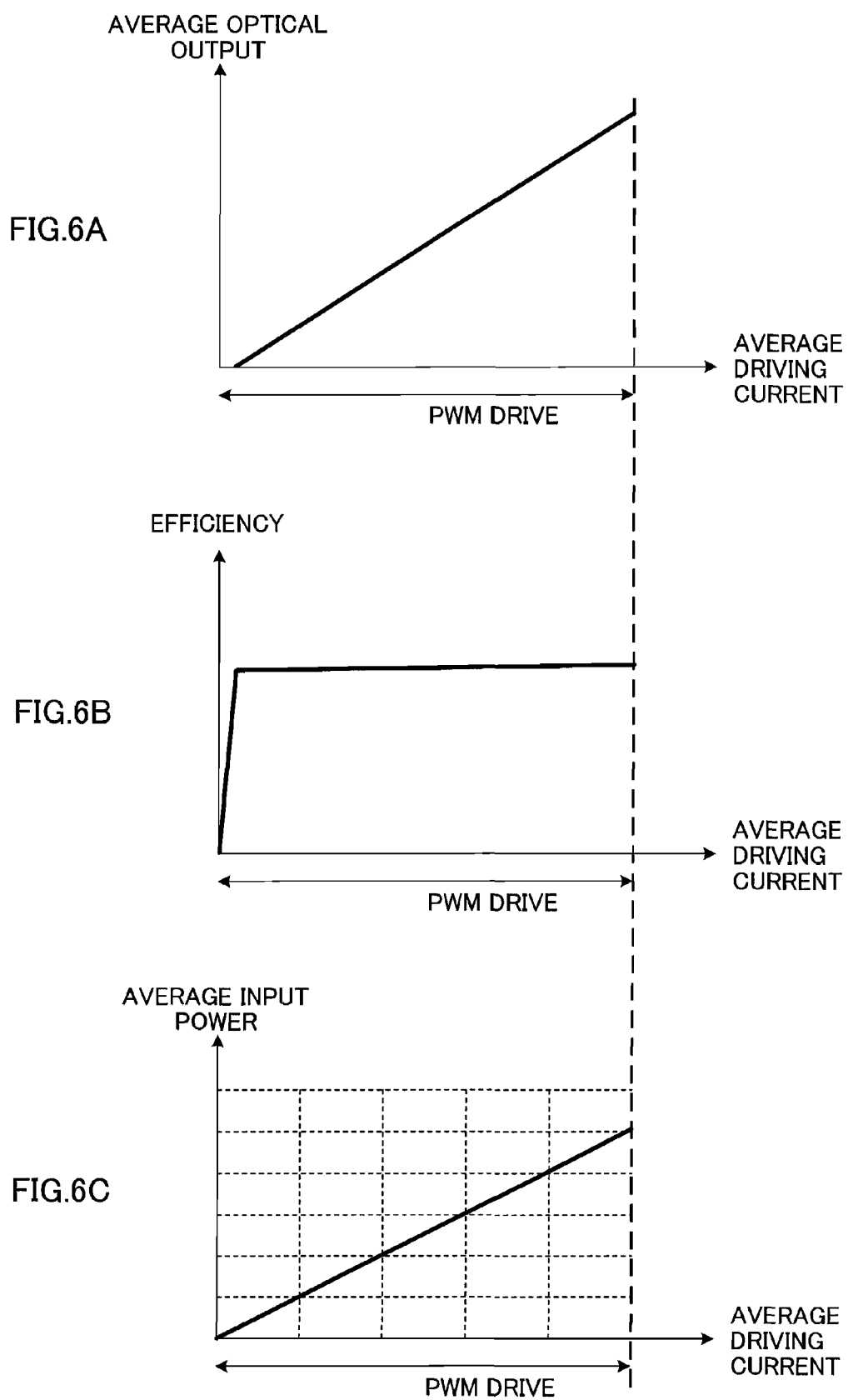
FIG. 6A is an illustrative graph of an average driving current versus optical output characteristic (optical output) at PWM drive.
FIG. 6B is an illustrative graph of an average driving current versus optical output characteristic (efficiency) at PWM drive.
FIG. 6C is an illustrative graph of an average driving current versus optical output characteristic (average input power) at PWM drive.

FIGS. 6A to 6C show relationships between an average driving current and, an average optical output and efficiency at PWM drive. The drive voltage of a semiconductor laser device is substantially constant, and therefore, the average input power is substantially proportional to the average driving current as shown in FIG. 6C. FIG. 6A shows a relationship between the average driving current and the average optical output. The average optical output increases in proportional to the average driving current. The efficiency is, as shown in FIG. 6B, constant regardless of the average driving current.

The above-described efficiency is a ratio of the optical output from a laser device using a nonlinear optical crystal to the input power injected into an excitation semiconductor laser unit. The drive voltage of the semiconductor laser unit is substantially constant, and therefore, the input power is substantially proportional to the driving current of the semiconductor laser unit. Accordingly, the efficiency is the average optical output divided by the average input power, that is, the average optical output divided by the average driving current, and the average optical output per unit average driving current has a value proportional to the efficiency, so that temperature should be controlled so as to maximize this value.

Embodiment 1

Figure 7:
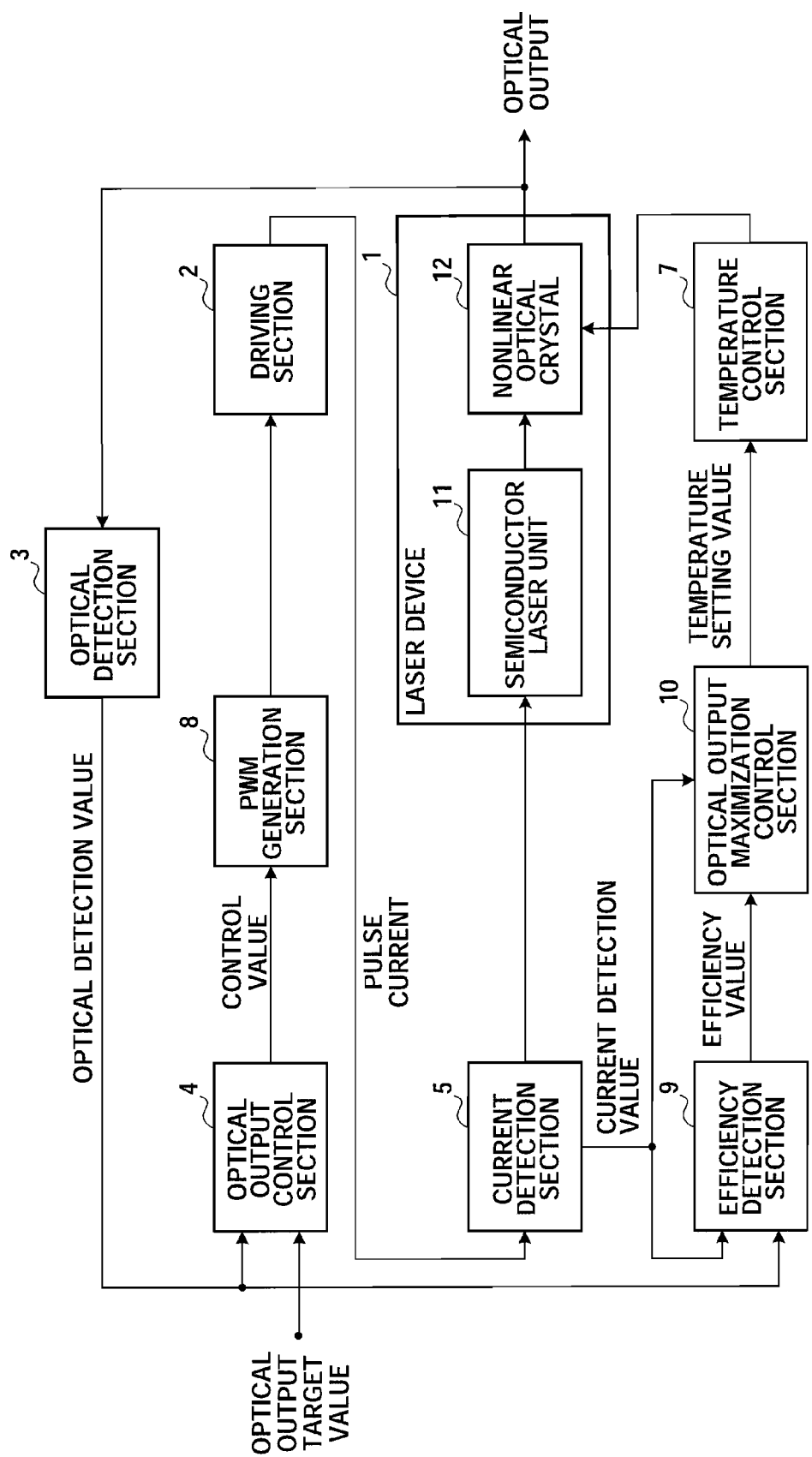
FIG. 7 is a block diagram showing a configuration of a laser driving apparatus according to Embodiment 1 of the present invention.

FIG. 7 is a block diagram showing a configuration of the laser driving apparatus according to Embodiment 1 of the present invention.

In FIG. 7, reference numeral 1 denotes a laser device including semiconductor laser unit 11 serving as an excitation laser unit that emits excited laser light and nonlinear optical crystal 12 serving as an optical wavelength conversion element that converts the excited laser light having a wavelength, as a fundamental wave, to laser light having a predetermined wavelength. Reference numeral 2 denotes a driving section for driving semiconductor laser unit 11 to cause semiconductor laser unit 11 to emit excited laser light. Reference numeral 3 denotes an optical detection section for outputting an optical detection value, which is a detected average value of an optical output from laser device 1. Reference numeral 4 denotes an optical output control section for outputting a control value such that the optical detection value from optical detection section 3 matches an optical output target value. Reference numeral 5 denotes a current detection section for outputting a current detection value, which is a detected average value of the laser driving current of driving section 2. Reference numeral 7 denotes a temperature control section for controlling the temperature of nonlinear optical crystal 12. Reference numeral 8 denotes a PWM generation section for converting the control value from optical output control section 4 into pulses by PWM, and outputting the pulses to driving section 2. Reference numeral 9 denotes an efficiency detection section for calculating an average optical output per unit average current, that is, an efficiency value, by dividing the optical detection value detected by optical detection section 3 by the current detection value detected by current detection section 5. Reference numeral 10 denotes an optical output maximization control section for finding a temperature setting value such that the efficiency value obtained by efficiency detection section 9 is maximum.

By converting a control value outputted from optical output control section 4 into pulses by PWM generation section 8, and by pulse driving laser device 1 using nonlinear optical crystal 12 through driving section 2, the efficiency can be kept substantially constant. Current detection section 5 detects an average value of a laser driving current, and optical detection section 3 detects an average value of an optical output. Then, using these values, efficiency detection section 9 calculates an average optical output per unit average current. By performing pulse drive, the efficiency of laser device 1 using nonlinear optical crystal 12 is substantially constant, so that the average optical output value per unit average current, that is, an efficiency value, is substantially constant regardless of the optical output target value. Then, optical output maximization control section 10 finds a temperature setting value such that this efficiency value is maximum, and temperature control section 7 controls a temperature such that the temperature of nonlinear optical crystal 12 reaches this setting value. By the above-described operations, regardless of the magnitude of the optical output target value, it is possible to operate such that the optical output is maximum for the optical output target value at any given time.

PWM generation section 8 converts a control value from optical output control section 4, which controls an optical output from laser device 1 using nonlinear optical crystal 12 by a deviation between an optical output target value and an optical detection value, into pulses, and causes laser device 1 using nonlinear optical crystal 12 to pulse drive. The efficiency is substantially constant at pulse drive, even when the control value varies and thus the average optical output varies, the efficiency according to the temperature of nonlinear optical crystal 12 at any given time can be kept substantially constant. A value acquired by dividing an average optical output detected by optical detection section 3 by an average driving current detected by current detection section 5 is substantially proportional to the efficiency. Thus, efficiency detection section 9 finds this value and optical output maximization control section 10 finds a temperature setting value such that this value is maximum, and then temperature control section 7 controls a temperature of nonlinear optical crystal 12. By this means, it is possible to control the temperature such that the efficiency is maximum, that is, the optical output is maximum even when adjusting light where an arbitrary optical output target value is provided.

Figure 8B:
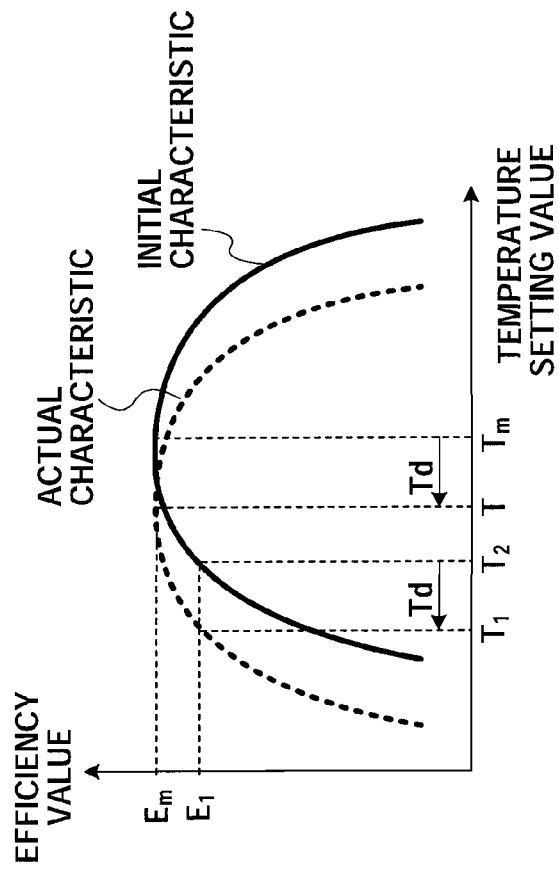
FIG. 8B is an illustrative graph showing another example of the operation of the laser driving apparatus according to Embodiment 1 of the present invention.
Figure 8A:
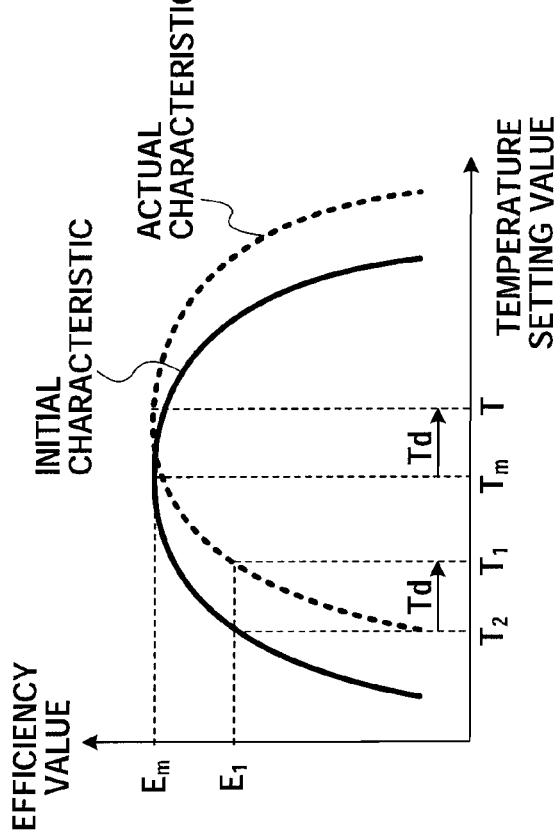
FIG. 8A is an illustrative graph showing an example of the operation of the laser driving apparatus according to Embodiment 1 of the present invention.

Next, the operation of optical output maximization control section 10 will be described using FIGS. 8A and 8B. In the temperature versus optical output characteristic of nonlinear optical crystal 12, as described using FIG. 1, there is a temperature at which the optical output is maximum, but the temperature changes over time. FIGS. 8A and 8B show the states of the change. FIG. 8A shows an example of a case where a temperature setting value at which an efficiency value is maximum changes to a higher value. FIG. 8B shows an example of a case where a temperature setting value at which an efficiency value is maximum changes to a lower value.

Figure 1:
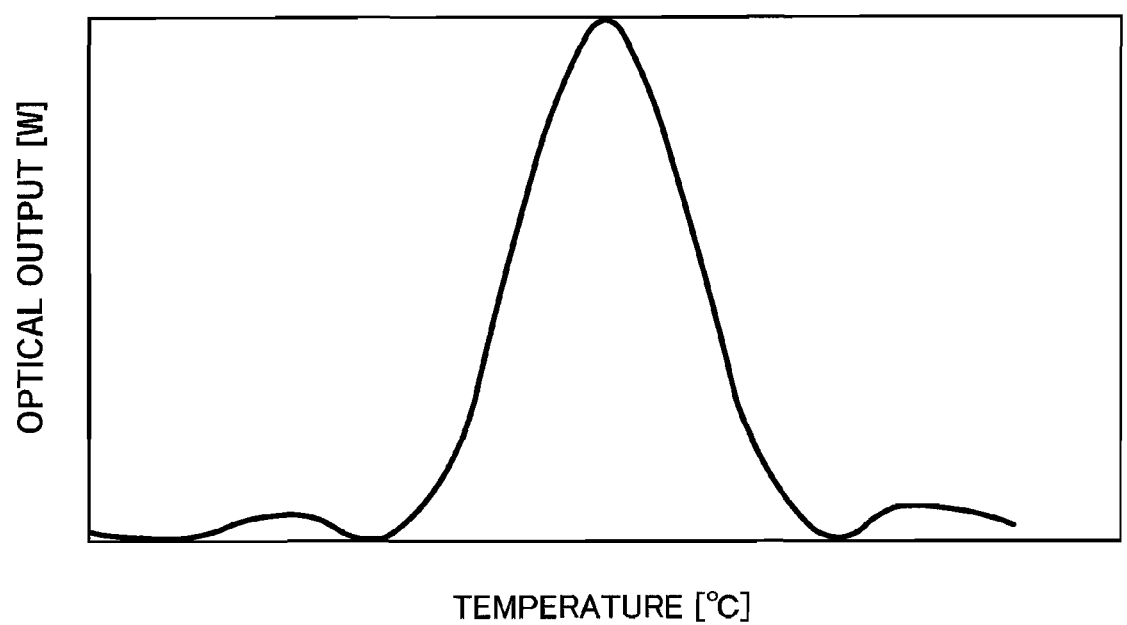
FIG. 1 is an illustrative graph of dependence on temperature of an optical output of a laser device using a wavelength conversion element.

FIGS. 8A and 8B are enlarged graphs of a portion in FIG. 1 where the optical output is maximum. A horizontal axis represents the temperature setting value, which is outputted from optical output maximization control section 10, and which corresponds to the temperature in FIG. 1, a vertical axis represents the efficiency value, which is outputted from efficiency detection section 9, and which corresponds to the optical output in FIG. 1, a solid-line represents an initial characteristic, and a broken-line represents an actual characteristic. Further, the maximum value of the efficiency value of the initial characteristic is Em and the temperature setting value at this time is Tm.

Optical output maximization control section 10 stores in advance initial characteristics represented by the solid lines in FIGS. 8A and 8B. Then, when, for example, the laser driving apparatus is turned on, optical output maximization control section 10 outputs the setting temperature T1 which is lower or higher than the Tm by a predetermined temperature. As a result, optical output maximization control section 10 acquires the efficiency value E1 as input. Optical output maximization control section 10 finds the temperature setting value T2 obtained by applying E1 to the initial characteristic, regards a difference between T1 and T2 as Td, which is the amount of change over time of Tm, and outputs the temperature setting value T obtained by adding Td to Tm, to temperature control section 7 as a temperature setting value at which the efficiency value is maximum.

As described above, by the temperature setting value found by optical output maximization control section 10, temperature control section 7 controls the temperature of nonlinear optical crystal 12. This makes it possible to control a temperature such that the optical output is maximum, even when adjusting light where an arbitrary optical output target value is provided.

In a range where the optical output target value is small, the pulse width of a laser driving current is narrow. For this reason, due to the influence of slopes such as pulse rise and fall, the efficiency may fall at which an average driving current is low as shown in FIG. 6B. As a result, control to maximize the optical output may become unstable. To avoid this, optical output maximization control section 10 accepts as input a current detection value from current detection section 5. Then, in a range where the current detection value is smaller than a predetermined value, optical output maximization control section 10 does not perform a control operation and holds a previous value.

Further, if fluctuation of a current detection value is significant, control may become unstable. For this reason, if fluctuation of a current detection value is significant, a control operation may not be performed.

Further, control is more stable when the current detection value increases. For this reason, the control may be performed when the current detection value is close to a maximum value.

In the present embodiment, current detection section 5 detects an average driving current of driving section 2. Alternatively, a control value outputted from optical output control section 4 may be detected, a duty cycle of an output from PWM generation section 8 or driving section 2 may be detected, or a duty cycle of an optical output from laser device 1 may be detected.

Further, in the present embodiment, efficiency detection section 9 finds an efficiency value by dividing an optical detection value by a current detection value. Alternatively, a value obtained by sampling a pulse amplitude value of an optical output from laser device 1 may be used as an efficiency value.

Embodiment 2

Figure 2:
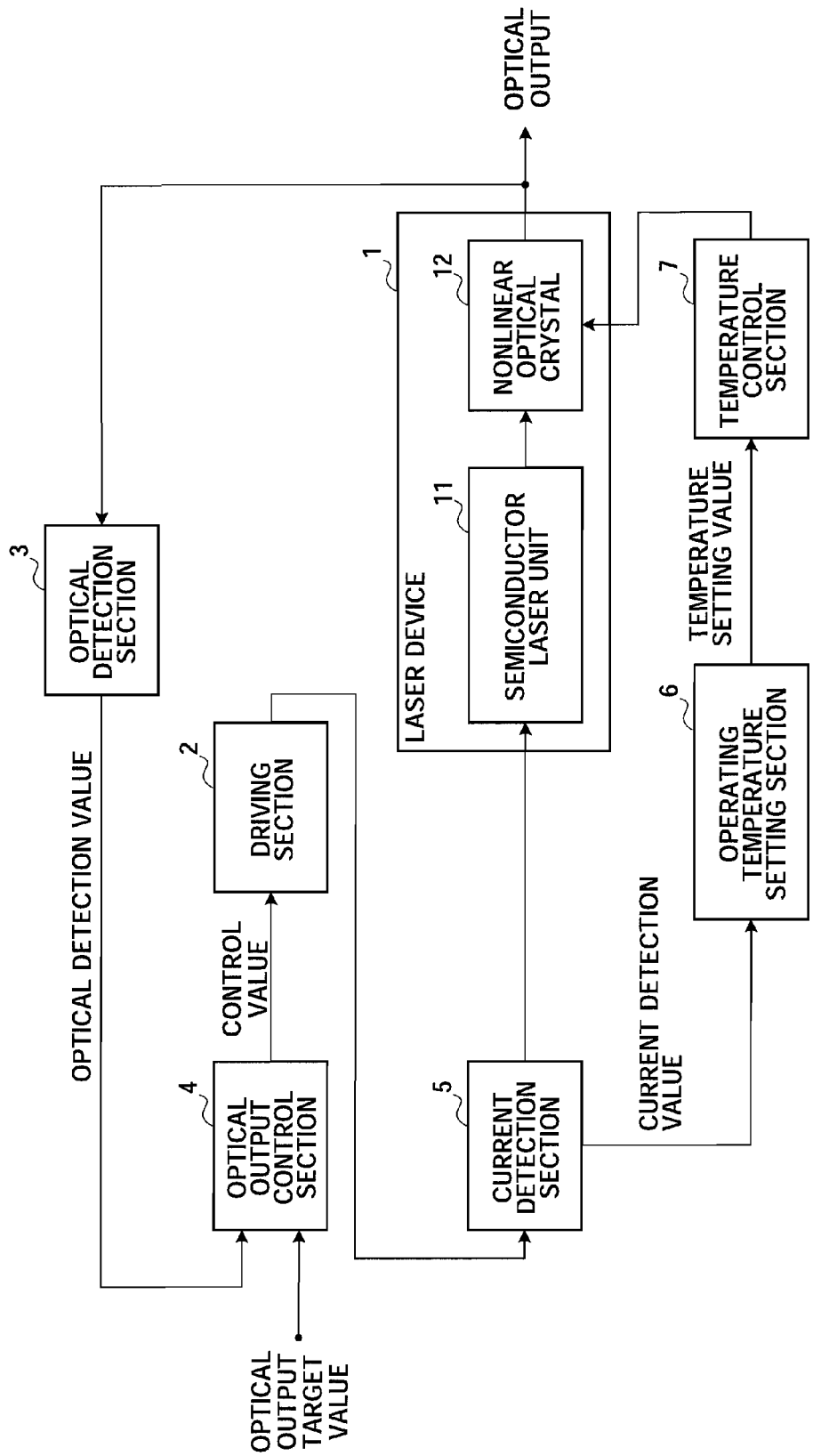
FIG. 2 is a block diagram showing a configuration of an example of a conventional laser driving apparatus.
Figure 3:
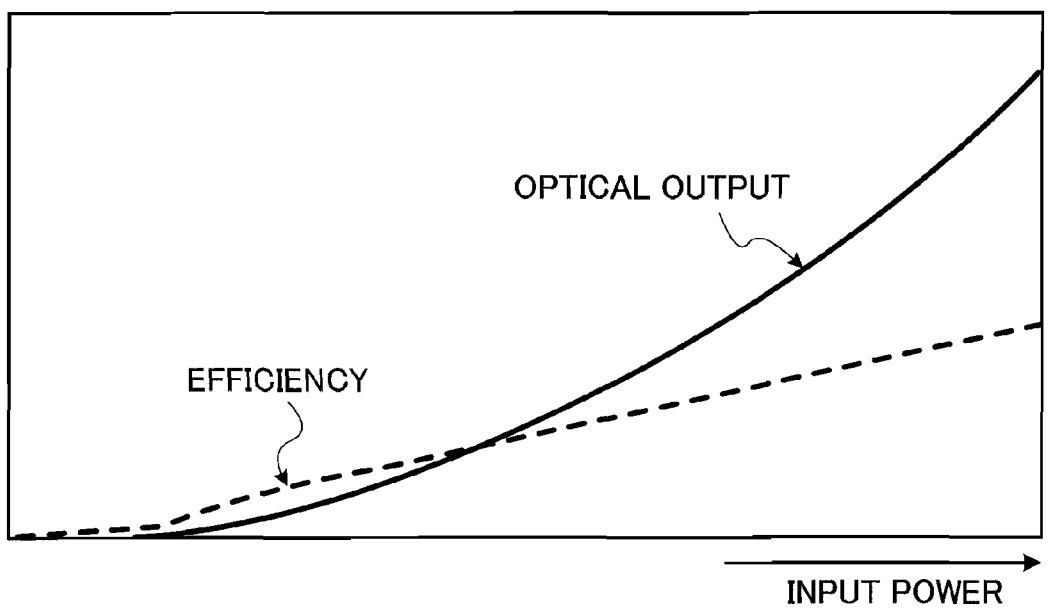
FIG. 3 is an illustrative graph of input power versus optical output characteristic at linear drive.
Figure 4A:
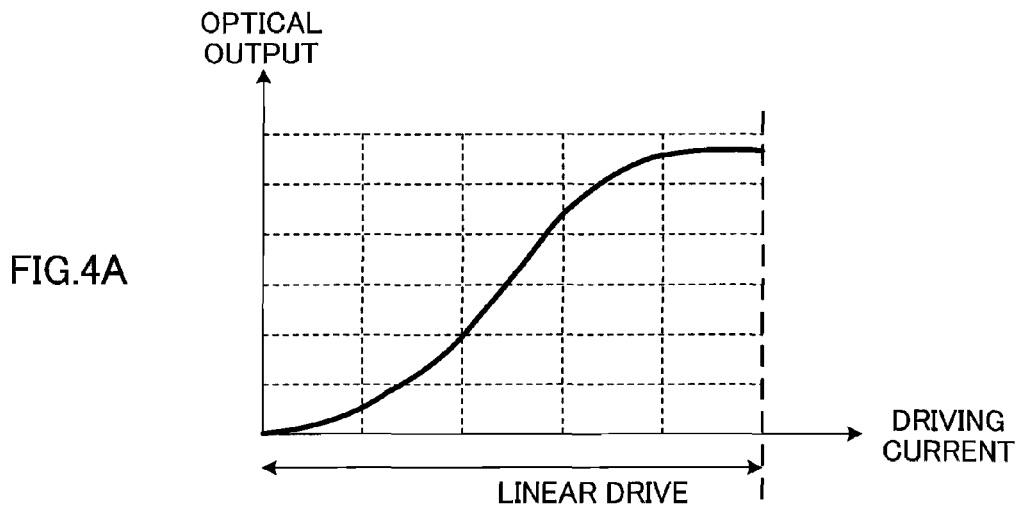
FIG. 4A is an illustrative graph of a drive current versus optical output characteristic (optical output) at linear drive.
Figure 4B:
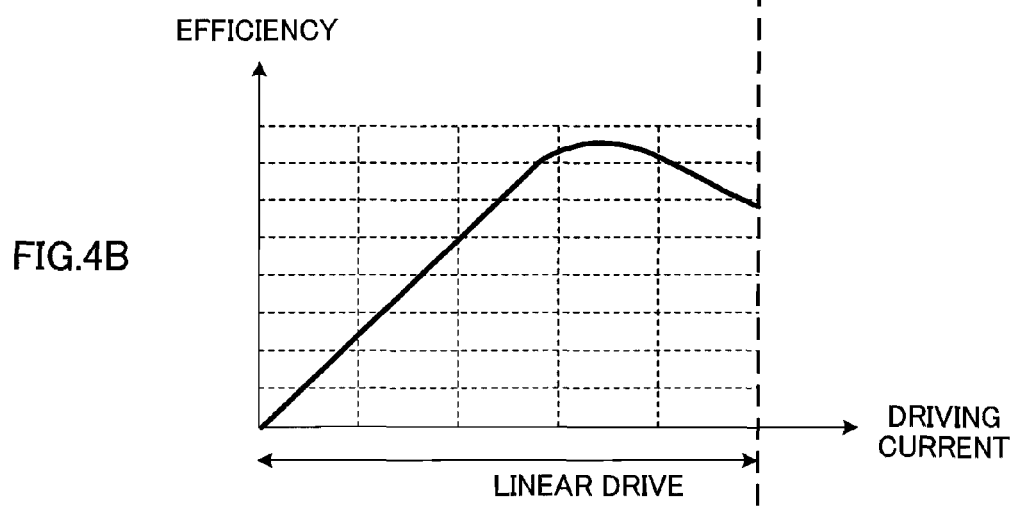
FIG. 4B is an illustrative graph of a drive current versus optical output characteristic (efficiency) at linear drive.
Figure 4C:
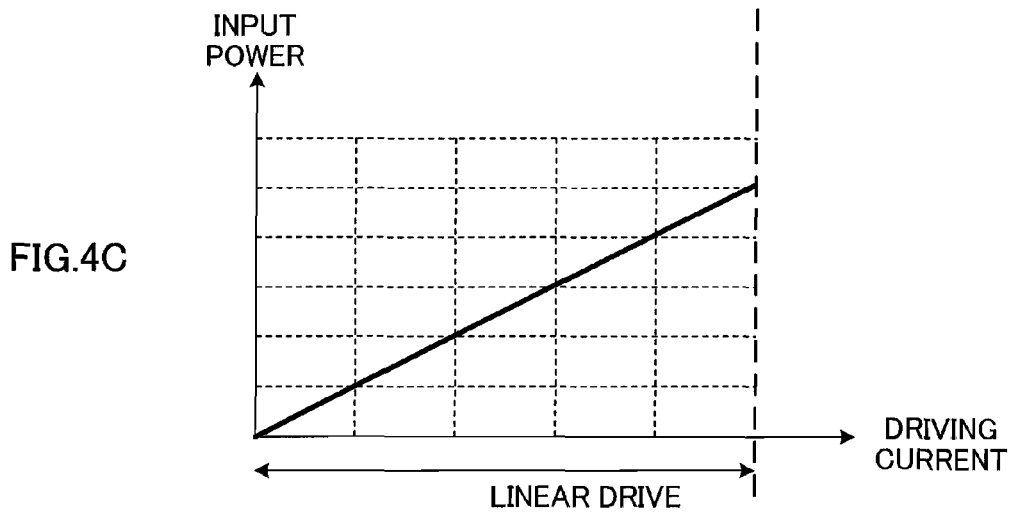
FIG. 4C is an illustrative graph of a drive current versus optical output characteristic (input power) at linear drive.
Figure 5:
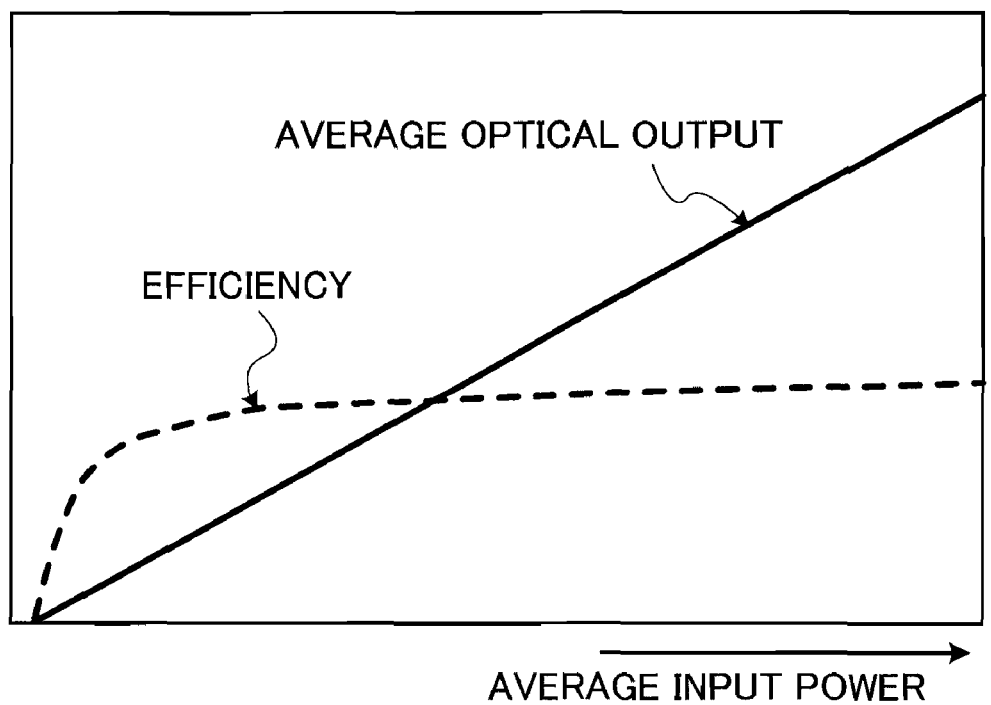
FIG. 5 is an illustrative graph of an average input power versus optical output characteristic at PWM drive.

A configuration of Embodiment 2 of the present invention is the same as in Embodiment 1 shown in FIG. 7 but the operation of optical output maximization control section 10 is different. The operation of optical output maximization control section 10 in the present embodiment is similar to operating temperature setting section 6 shown in FIG. 2. The operation will be described below.

Optical output maximization control section 10 first receives as input the efficiency value E0 for the current temperature setting value T0. Then, optical output maximization control section 10 outputs the temperature setting value T0+ΔT obtained by changing T0 to a higher value by the micro value ΔT, and receives the efficiency value E1 as input. If E1 is greater than E0, optical output maximization control section 10 holds T0+ΔT as the temperature setting value. If E1 is smaller than E0, optical output maximization control section 10 outputs the temperature setting value T0−ΔT obtained by changing T0 to the low-temperature side by the micro value ΔT, and receives the efficiency value E2 as input. If E2 is greater than E0, optical output maximization control section 10 holds T0−ΔT as the temperature setting value. If E2 is smaller than E0, optical output maximization control section 10 resets the temperature setting value to T0 and holds T0. By the above-described operation, optical output maximization control section 10 outputs a temperature setting value at which the efficiency value is maximum, to temperature control section 7.

As described above, temperature control section 7 controls a temperature of nonlinear optical crystal 12, by the temperature setting value found by optical output maximization control section 10. By this means, even when adjusting light where an arbitrary optical output target value is provided, it is possible to control the temperature such that the optical output is maximum.

What is claimed is:

1. A laser driving apparatus comprising:

a laser device that includes an excitation laser unit that emits excited laser light and an optical wavelength conversion element that converts the excited laser light, as a fundamental wave, to laser light having a predetermined wavelength, and that emits the laser light, as an optical output, whose wavelength is converted by the optical wavelength conversion element;

a driving section that drives the excitation laser unit of the laser device by a pulse current;

an optical detecting section that detects an average value of the optical output in a pulse form emitted from the laser device and outputs the average value as an optical detection value;

a current detecting section that detects a value corresponding to an average value of the pulse current and outputs the value as a current detection value;

an efficiency detecting section that outputs, as an efficiency value, a value obtained by dividing the optical detection value by the current detection value;

a maximization control section that receives as input the efficiency value and derives a temperature setting value such that the efficiency value is maximum;

a temperature control section that controls a temperature of the optical wavelength conversion element to reach the temperature setting value;

wherein the maximization control section holds in advance a characteristic of the efficiency value for the temperature setting value and sets, as Tm, the temperature setting value at which the efficiency value in the characteristic is maximum, then the maximization control section first outputs a temperature setting value T1 which is lower or higher than Tm by a predetermined temperature, sets, as T2, a temperature setting value obtained by applying an efficiency value input as a result of outputting the temperature setting value T1 to the characteristic, and derives Tm+(T1−T2) as a temperature setting value at which the efficiency value is maximum.

2. A laser driving apparatus comprising:
a laser device that includes an excitation laser unit that emits excited laser light and an optical wavelength conversion element that converts the excited laser light, as a fundamental wave, to laser light having a predetermined wavelength, and that emits the laser light, as an optical output, whose wavelength is converted by the optical wavelength conversion element;
a driving section that drives the excitation laser unit of the laser device by a pulse current;
an optical detecting section that detects an average value of the optical output in a pulse form emitted from the laser device and outputs the average value as an optical detection value;
a current detecting section that detects a value corresponding to an average value of the pulse current and outputs the value as a current detection value;
an efficiency detecting section that outputs, as an efficiency value, a value obtained by dividing the optical detection value by the current detection value;
a maximization control section that receives as input the efficiency value and derives a temperature setting value such that the efficiency value is maximum;
a temperature control section that controls a temperature of the optical wavelength conversion element to reach the temperature setting value;
wherein the maximization control section first receives as input an efficiency value E0 for a current temperature setting value T0, then outputs a temperature setting value T0+ΔT obtained by changing the temperature setting value T0 by a micro value ΔT and receives as input an efficiency value E1, either holds T0+ΔT as the temperature setting value or resets the temperature setting value to T0 and holds T0, based on a result of a comparison between E1 and E0, thereby deriving a temperature setting value at which the efficiency value is maximum.

3. A laser driving apparatus comprising:
a laser device that includes an excitation laser unit that emits excited laser light and an optical wavelength conversion element that converts the excited laser light, as a fundamental wave, to laser light having a predetermined wavelength, and that emits the laser light, as an optical output, whose wavelength is converted by the optical wavelength conversion element;
a driving section that drives the excitation laser unit of the laser device by a pulse current;
an efficiency detecting section that detects an amplitude value of the optical output in a pulsed form emitted from the laser device and outputs the amplitude value as an efficiency value;
a maximization control section that receives as input the efficiency value and derives a temperature setting value such that the efficiency value is maximum; and
a temperature control section that controls a temperature of the optical wavelength conversion element to reach the temperature setting value;
wherein the maximization control section holds in advance a characteristic of the efficiency value for the temperature setting value and sets, as Tm, the temperature setting value at which the efficiency value in the characteristic is maximum, then the maximization control section first outputs a temperature setting value T1 which is lower or higher than Tm by a predetermined temperature, sets, as T2, a temperature setting value obtained by applying an efficiency value input as a result of outputting the temperature setting value T1 to the characteristic, and derives Tm+(T1−T2) as a temperature setting value at which the efficiency value is maximum.

4. A laser driving apparatus comprising:
a laser device that includes an excitation laser unit that emits excited laser light and an optical wavelength conversion element that converts the excited laser light, as a fundamental wave, to laser light having a predetermined wavelength, and that emits the laser light, as an optical output, whose wavelength is converted by the optical wavelength conversion element;
a driving section that drives the excitation laser unit of the laser device by a pulse current;
an efficiency detecting section that detects an amplitude value of the optical output in a pulsed form emitted from the laser device and outputs the amplitude value as an efficiency value;
a maximization control section that receives as input the efficiency value and derives a temperature setting value such that the efficiency value is maximum;
a temperature control section that controls a temperature of the optical wavelength conversion element to reach the temperature setting value;
wherein the maximization control section first receives as input an efficiency value E0 for a current temperature setting value T0, then outputs a temperature setting value T0+ΔT obtained by changing the temperature setting value T0 by a micro value ΔT and receives as input an efficiency value E1, either holds T0+ΔT as the temperature setting value or resets the temperature setting value to T0 and holds T0, based on a result of a comparison between E1 and E0, thereby deriving a temperature setting value at which the efficiency value is maximum.

* * * * *